United States Patent [19]

Langenbach et al.

[11] 4,045,109

[45] Aug. 30, 1977

[54] ELECTRONIC PACKAGING ASSEMBLY

[75] Inventors: Jack E. Langenbach, Newport Beach; John L. Hawkins, Whittier, both of Calif.

[73] Assignee: International Telephone and Telegraph Corporation, New York, N.Y.

[21] Appl. No.: 664,890

[22] Filed: Mar. 8, 1976

[51] Int. Cl.² ........................................... H01R 13/62
[52] U.S. Cl. ................... 339/75 M; 339/91 R
[58] Field of Search ............... 339/74 R, 75 R, 17, 339/17 P, 66 M, 91 R, 112 R, 119 R

[56] References Cited

U.S. PATENT DOCUMENTS

| | | | |
|---|---|---|---|
| 3,594,698 | 7/1971 | Anhalt | 339/75 M |
| 3,950,059 | 4/1976 | Anhalt et al. | 339/75 M |

OTHER PUBLICATIONS

Zero Insertion Connector with Individually Replacable Contacts, Anzalone et al., IBM Technical Disclosure Bulletin, vol. 17, No. 2, pp. 442–443, July 1974.

Primary Examiner—Roy Lake
Assistant Examiner—E. F. Desmond
Attorney, Agent, or Firm—Thomas L. Peterson

[57] ABSTRACT

An electronic packaging assembly in which a box containing electronic components is slidably mounted on a support and carries at its rear an electrical connector assembly which engages with a mating connector member mounted at the rear of the support with zero insertion force. Means is provided for moving the contacts mounted in the connector assembly at the rear of the box to bring the respective contacts in the two connector halves into engagement. Such means includes a motion transmitting element which extends through the box and a pivoted handle at the front of the box which actuates the motion transmitting element. A hook is provided on the handle which latches the front of the box to the support simultaneously with the actuating of the movable contacts. The connector assembly is a modular assembly in which individual connector modules containing either movable or fixed contacts may be mounted in any arrangement in the shell of the assembly. The actuating mechanism shifts the movable contacts in those modules containing such contacts regardless of the position of the modules in the connector shell.

23 Claims, 11 Drawing Figures

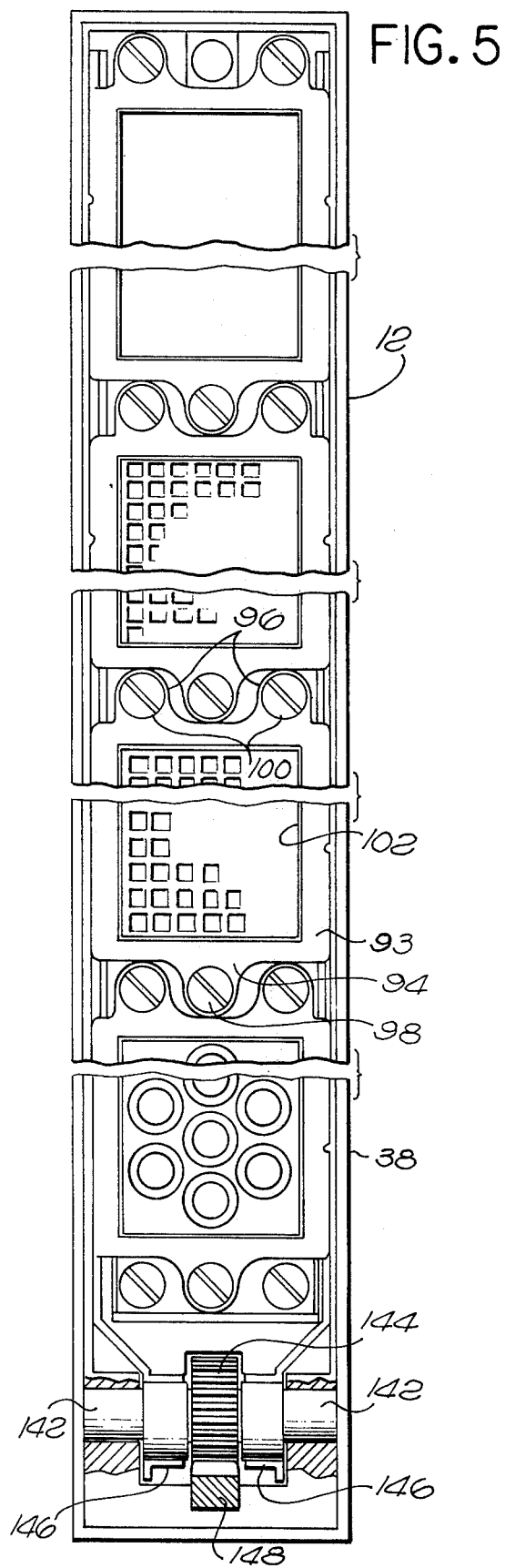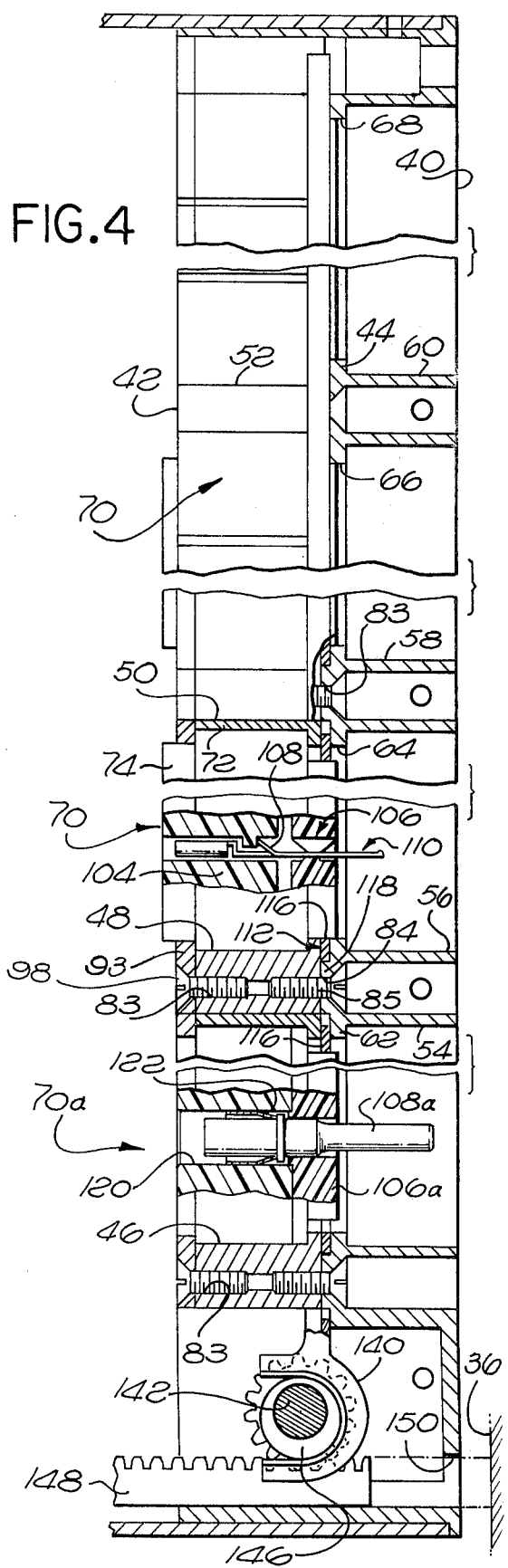

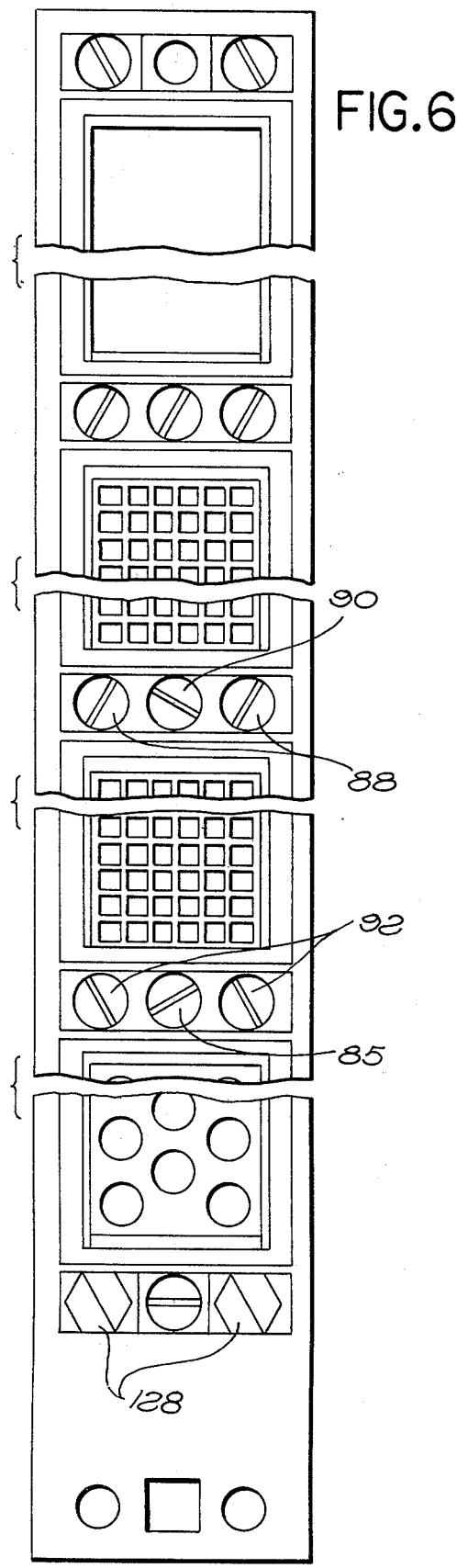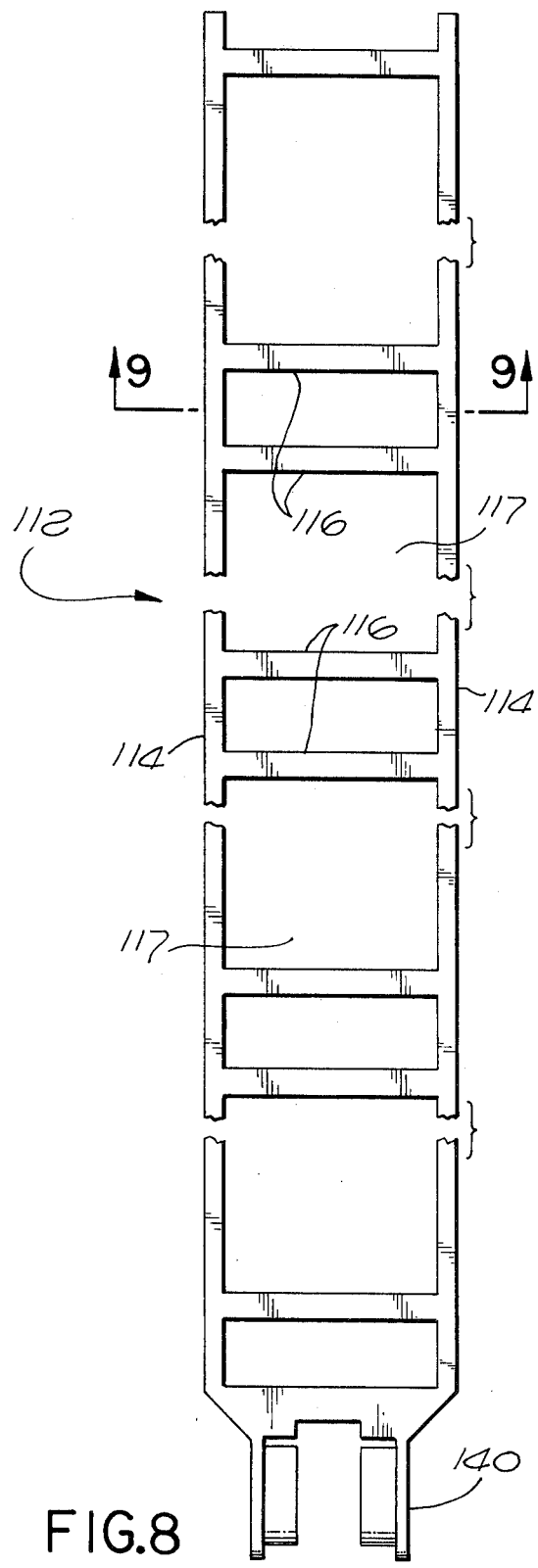

ELECTRONIC PACKAGING ASSEMBLY

BACKGROUND OF THE INVENTION

This invention relates generally to an electronic packaging assembly including a box and a support therefor and, more particularly, to such an assembly in which a connector member on the rear of the box is mated with a connector member at the rear of the support with zero insertion force.

It is common practice in aircraft to mount avionics "black boxes" on shelves with an electrical connector member mounted on the back of each box which engages with a mating connector half mounted on the rear of the shelf when the box is slid fully to the rear of the shelf. The avionics black box contains electronic circuitry and components necessary for controlling the various functions of the aircraft. As aircraft avionics become more complex, the number of wires required to connect the box to the aircraft's wiring increases. The forces required to mate the two connector halves of the connector associated with each box now used in these applications is proportional to the number of contacts. For example, a box having approximately 600 contacts has an insertion or mating force of about 200 lbs. It is therefore desirable that a connector be utilized for this application which has zero insertion force. Connectors of this general type are well known in the art. An example of such a connector is disclosed in U.S. Pat. No. 3,594,698 to Anhalt. Such a connector contains fixed contacts in one connector half and movable contacts in the second connector half. An actuating plate is provided in such second connector half, which when shifted, moves the movable contacts into electrical engagement with fixed contacts in the first connector half.

In order to utilize a zero insertion force connector in an aircraft avionic assembly as described hereinabove, there is required some means at the front of the shelf which supports the box to actuate the connector at the rear of the shelf. Reference is made to copending application of Jack E. Langenbach entitled, "Electronic Packaging Assembly," Ser. No. 545,148, filed Jan. 29, 1975, now U.S. Pat. No. 3,977,749 assigned to the assignee of the present application, which shows such an arrangement. In the Langenbach assembly, one connector half containing fixed contacts is mounted at the rear of the box and the mating connector half which contains the movable contacts of the zero insertion force connector is mounted at the rear of the support. An actuating arm is provided at the front of the support for moving the movable contacts in tandem in the connector member at the rear of the support to engage the fixed contacts in the connector member at the rear of the box. The contact actuating means also includes means for positively latching the box to prevent the box from lifting off of the support. While such an arrangement is entirely satisfactory in operation, the aircraft industry has recently expressed a desire that the actuating mechanism and the movable contacts be mounted on the box, rather than on the support as in the Langenbach arrangement. The reason for this modification is that occasionally the actuating mechanism and the connector half containing the movable contacts require repair or servicing, which may be more easily performed by removing the box from the aircraft and working on the box in a shop rather than working on such mechanisms if they are permanently installed on an aircraft. Furthermore, any servicing of an aircraft on the ground results in lost flight time and, therefore, loss of revenues. An electronic packaging assembly having movable contacts and actuating mechanism therefor on the box has been demonstrated. However, in such assembly, the actuating mechanism for the movable contacts was mounted on the outside of the box. Such an arrangement has the disadvantage that the actuating mechanism may become damaged during handling of the box and makes handling of the box by a technician awkward. Furthermore, the mechanism in the unit which has been demonstrated was complex and costly. Therefore, it would be desirable and constitutes one of the objects of the present invention to provide an electronic packaging assembly for an avionics box in which the actuating mechanism for the movable contacts mounted at the rear of the box extends through the box, rather than along the sides thereof, and is simple in construction, reliable, and relatively inexpensive.

Reference is made to U.S. Pat. No. 3,853,379 to Goodman et al. as relevant prior art in that it discloses an actuated printed circuit board assembly in which the board is inserted into a supporting frame for engagement with an electrical connector with zero insertion force. The movable contacts are mounted on the frame while fixed contacts are mounted on the board. After the board is mounted on the frame, the movable contacts on the frame are cam actuated to make electrical engagement with the associated contacts on the printed circuit board. The actuating mechanism is mounted on the frame adjacent to the front of the board. The actuating mechanism includes a latch for releasably retaining the board in the frame.

Electrical connector assemblies have also been utilized for aircraft applications in which the assemblies contain a plurality of zero insertion force connectors as well as one or more conventional connectors containing fixed contacts, such as mating pin and socket contacts, coaxial contacts, etc. In order to simultaneously actuate the movable contacts in the zero insertion force connectors in such an assembly it has been necessary to mount such connectors adjacent to each other in a row with an actuating cam at one end of the row. The connector containing the fixed contacts had to be mounted at the other end of the row so as not to interfere with the actuation of the movable contacts in the zero insertion force connectors. As a consequence, the arrangement of the two types of connectors in the connector assembly had to be permanent. For some applications, it would be more practical to provide a modular connector assembly in which individual connector modules of different types may be mounted in selected module cavities in the connector shell depending upon the particular electrical interconnection arrangement desired by the user. By the use of a modular connector assembly, the individual modules may be more conveniently wired by removing the modules from the shell and servicing of the connector assembly on the avionics box is simplified. It is another object of the present invention to provide such a modular assembly in which zero insertion force modules may be mounted together with conventional fixed contact connector modules in any desired arrangement in the module cavities in the shell of the assembly and simultaneous actuation of the movable contacts in the zero insertion force modules is accomplished regardless of the position of such modules in the shell. Thus, the modular connector permits a wide diversity in the type of connector modules used, and their locations, in a connector assembly.

SUMMARY OF THE INVENTION

According to the principal aspect of the present invention, a box containing electronic components is slidably mounted on a stationary support. A connector member is mounted on the rear of the box and contains a plurality of movable contacts. A second connector member containing fixed contacts is mounted at the rear of the support. When the box is shifted to the rear of the support, the two connector members mate with each other, but the contacts are spaced so that the connector members are mated with essentially zero force. Means including an actuating handle is provided at the front of the box for moving the movable contacts in tandem in the connector member at the rear of the box to engage the contacts in the mating connector halves. The contact moving means includes a motion transmitting element which extends through the box from the front to the rear thereof for transmitting movement from the actuating handle to a contact actuating member in the connector at the rear of the box. Since the motion transmitting means is disposed in the box, it is not readily subject to damage as it would be if on the outside of the box. The actuating mechanism is simple in structure and reliable, thereby assuring that proper electrical connections will be made between the avionics box and the connector on the support which carries the box.

According to another aspect of the invention, there is provided a modular electrical connector containing a plurality of module cavities which may receive either zero insertion force connector modules, conventional connector modules, or a combination thereof. The modules may be mounted in any arrangement in the connector shell and the actuating mechanism for the movable contacts in the zero insertion force modules is effective to actuate such contacts regardless of the cavities in which the modules are mounted. Preferably, the actuating mechanism for the modular connector comprises a cam at one end of the connector shell and a ladder-like frame which extends lengthwise of the shell and embodies laterally extending arms that extend into the module cavities in the shell. The conventional connector modules are designed so that when the actuating frame is shifted by rotation of the cam at one end of the shell, the modules will not be affected by such movement. However, the shifting of the frame by the cam imparts movement to a movable insulator in each of the zero insertion force connector modules which in turn actuates the movable contacts in such modules.

BRIEF DESCRIPTION OF THE DRAWINGS

FIG. 4 is a partial vertical sectional view through the connector assembly mounted at the rear of the avionics box illustrated in FIGS. 1-3, with the movable contacts in the zero insertion force connector modules of the assembly shown in their unactuated position;

FIG. 5 is a rear elevational view of the connector assembly illustrated in FIG. 4;

FIG. 6 is a front elevational view of the connector assembly illustrated in FIG. 4;

FIG. 8 is a front elevational view of the contact actuating member employed in the connector assembly.

DESCRIPTION OF THE PREFERRED EMBODIMENTS

Figure 1:
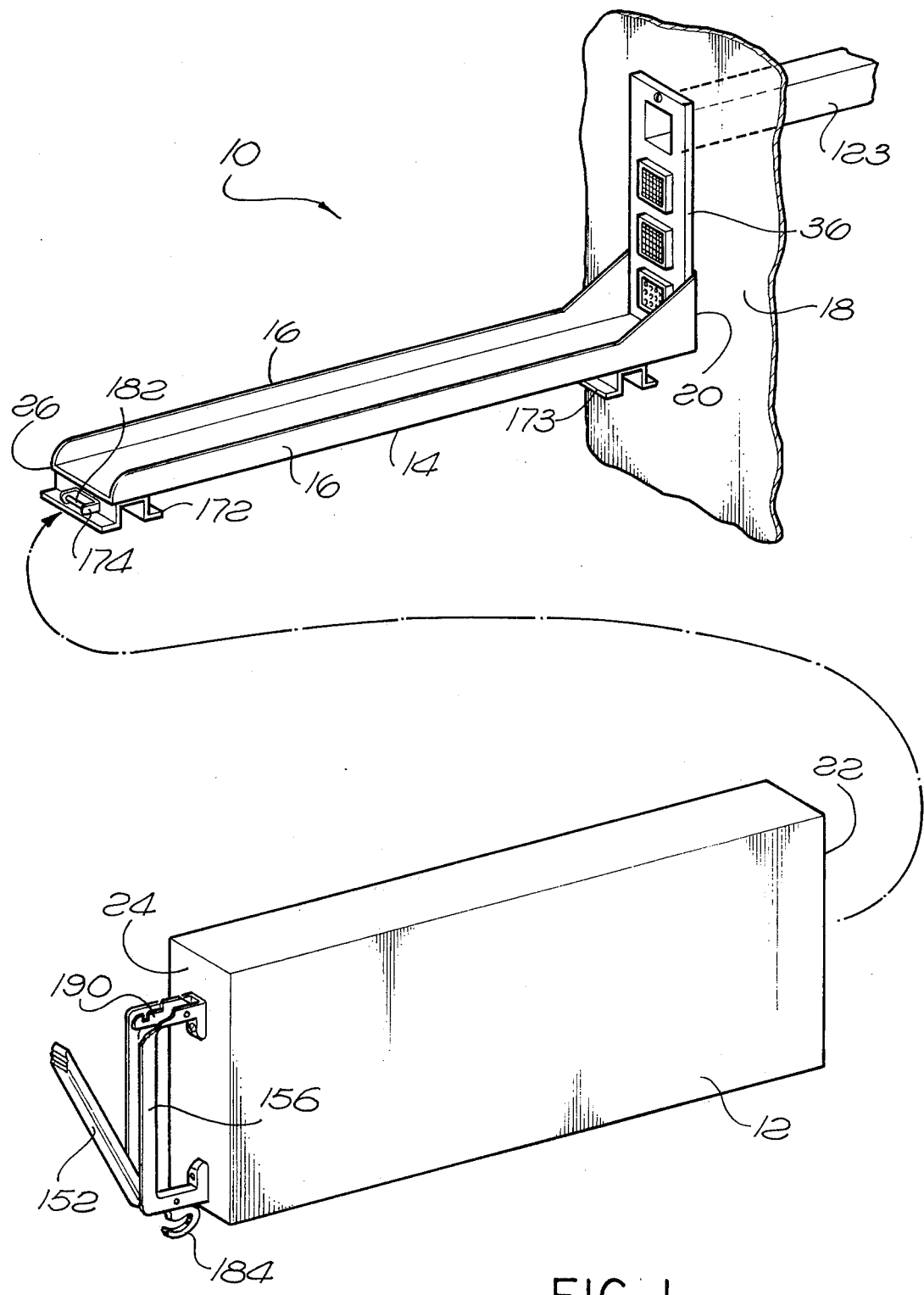
FIG. 1 is an exploded perspective view of an electronic packaging assembly in accordance with the present invention showing the avionics box removed from its support, with the actuating handle on the box shown in a partially actuated position.

Referring now to the drawings in detail, there is illustrated in FIGS. 1 to 9 one embodiment of the electronic packaging assembly of the present invention, generally designated 10. The assembly comprises an avionics box 12 which is mounted on the upper surface of a flat support or tray 14. The support includes vertical sides 16 for guiding sliding movement of the box on the support. While only a single box and tray have been illustrated, it will be appreciated that most often there will be a number of boxes supported by an elongated shelf in a typical aircraft application. A vertical stationary plate 18 is mounted at the rear 20 of support 14. When the box 12 is slid rearwardly on the support 14, the rear 22 of the box abuts against the back plate 18 and the front 24 of the box is adjacent to the front 26 of the support.

Figure 2:
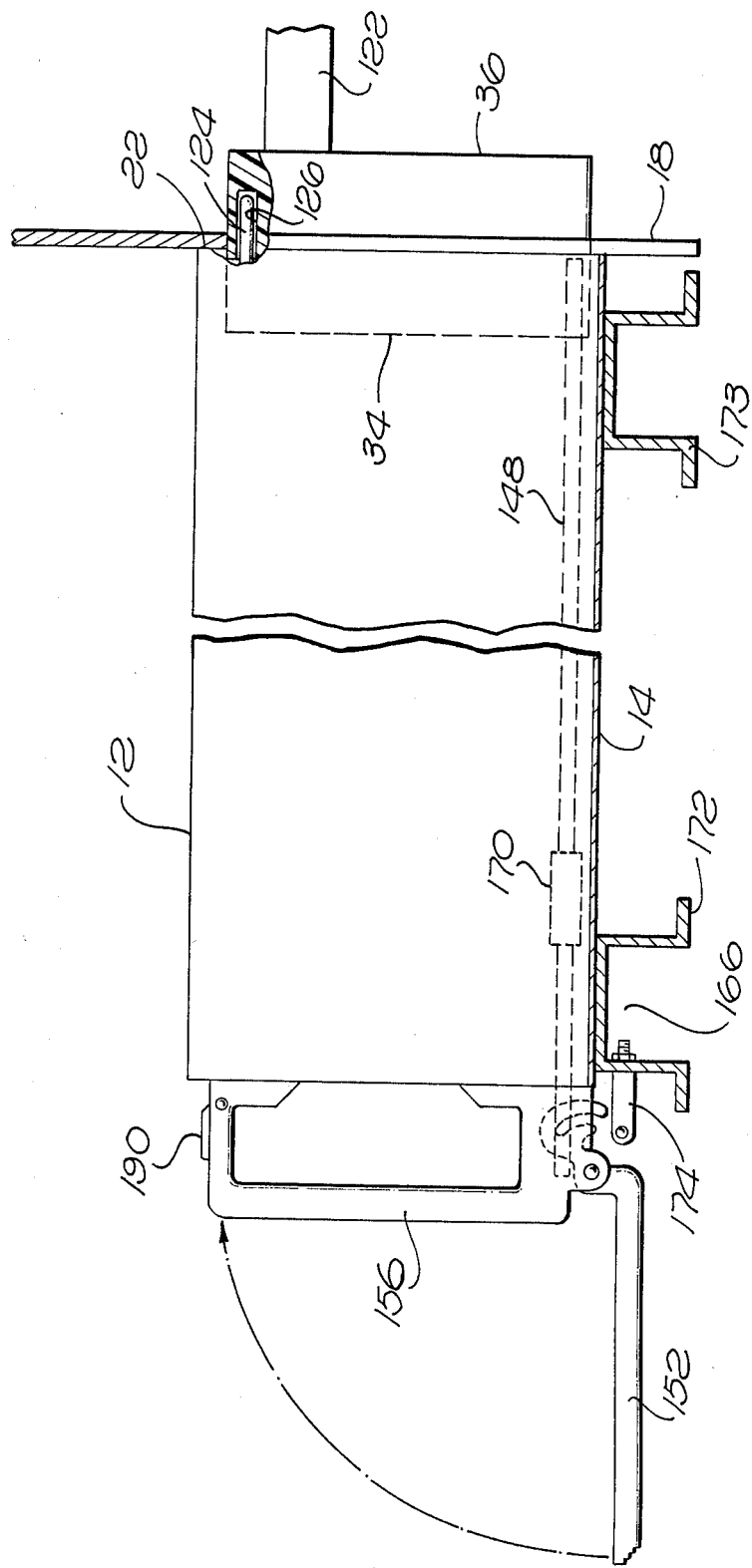
FIG. 2 is a side elevational view of the assembly illustrated in FIG. 1 showing the box mounted on its support with its actuating handle in the unactuated position.

As seen in FIG. 2, a connector assembly 34, shown schematically, is mounted at the rear 22 of the box 12 aligned with a mating connector member 36 mounted in the rear plate 18 so that the respective contacts in the connector members will engage when the connector members are mated by sliding the box to the rear of the support. In accordance with one feature of the invention, the connector assembly 34 has a modular construction. As best seen in FIGS. 4 to 6, the connector assembly 34 comprises an elongated upright shell 38 having a front 40 and a rear 42, and an elongated vertically extending partition 44 between the front and the rear of the shell. The shell embodies a plurality of connector module cavities disposed in a row and designated 46, 48, 50, and 52. Four of such cavities are shown by way of example only. Obviously, a larger or smaller number may be provided if desired. A like number of recesses 54, 56, 58, and 60 are provided in the shell in alignment with cavities and on the opposite side of the partition 44. The recesses open at the rear 42 of the shell. Openings 62, 64, 66, and 68 in the partition communicate the cavities with the corresponding recesses in the shell. The size and configuration of the cavities are identical as are the recesses.

Figure 7:
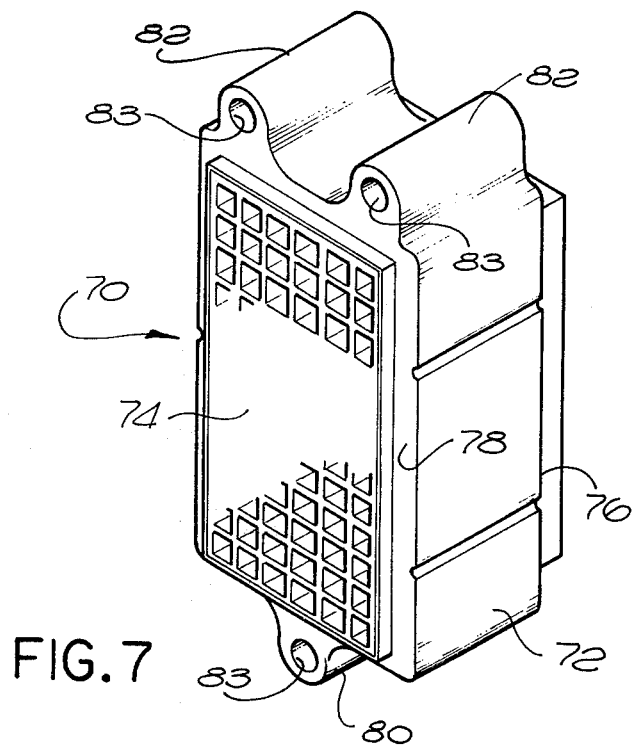
FIG. 7 is a perspective view of one of the connector modules mounted in the assembly illustrated in FIGS. 4 to 6.
Figure 9:
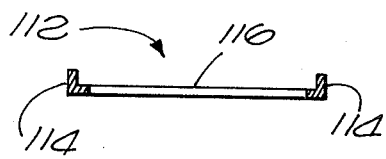
FIG. 9 is a transverse sectional view taken along line 9—9 of FIG. 8 showing the cross-section of the contact actuating member.

Individual connector modules may be mounted in any one or all of the cavities 46, 48, 50, and 52 in the shell, one of such modules being shown in perspective in FIG. 7 and designated 70. The module 70 may be a zero insertion force connector module. It comprises a module shell 72 containing an insulator 74 which extends beyond the front 76 and rear 78 of the shell. The lower end of the shell is formed with a centrally disposed outwardly projecting hub 80. A pair of like hubs 82 extend upwardly from the upper end of the shell. Each of the hubs has a threaded opening 83 therethrough. The shell of the module 70 is complementary to the cavities in the shell 38 of the connector assembly so that the module can be mounted in any of the cavities.

A row of three holes are formed in the partition 44 at the opposite ends of each of the module cavities. Only the central hole is visible in the drawings. Each such hole is designated 84. The holes 84 in each row are spaced apart corresponding to the lateral spacing of the holes 83 in hubs 80 and 82 on the module shell 72.

Two zero insertion force connector modules 70 are shown mounted in the cavities 48 and 50, respectively. Referring to the module 70 in cavity 48, a screw 85 in central hole 84 at the lower end of the cavity threads into the opening 83 in the hub 80 at the lower end of the shell 72 of the connector module to retain the module in the cavity. Two additional screws 88 inserted through the two outside holes 84, not shown, in the partition adjacent to the upper end of the cavity 48 are threadedly engaged in the openings 83 in the hubs 82 at the upper end of the shell 72. A screw 90 between screws 88 threads into the hub 80 on the lower end of the shell 72 of the connector module 70 mounted in the cavity 50. Screws 92 in the outside holes 83 at the lower end of the cavity 48 thread into the hubs on a connector module mounted in the cavity 46. Additional screws as shown complete the mounting of the modules in their respective cavities.

A cover 93 is mounted over the rear 78 of each connector module. The cover is formed with a central downwardly extending projection 94 and two upwardly extending spaced projections 96, as best seen in FIG. 5. Referring to the module 70 in cavity 48, for example, a screw 98 extends through a hole in the projection 94 and threads into the threaded opening 83 in the hub 80. Screws 100 pass through openings in the projections 96 and thread into the hubs 82 at the upper end of the shell 72. Thus, the screws 98 and 100 clamp the cover 93 on the rear 42 of the shell 36 to help retain the cover to the module 70. The cover has a rectangular opening 102 therein through which the insulator 74 extends a short distance. A module 70 is mounted in cavity 50 in the same fashion.

As seen in FIG. 4, the insulator 74 of the zero insertion force connector module 70 comprises a rear fixed part 104 and a front movable part 106. A plurality of contacts 108 are fixedly mounted in the rear part 104 of the insulator. Only one such contact is shown in FIG. 4. The front part 106 of the insulator is movable with respect to the rear part in a vertical direction. Upon upward vertical movement of the insulator part 106, the contacting end 110 of the contact which extends into the recess 56 will shift upwardly to engage a fixed contact in the connector member 36 in the manner described in detail in the aforementioned Anhalt and Goodman et al. patents.

The movable front part 106 of the insulator 74 is shifted vertically by means of a contact actuating member, generally designated 112. As best seen in FIG. 8, the actuating member comprises a ladder-like frame having a pair of elongated parallel sides 114 of L-shaped cross-section, to impart strength to the frame, and a plurality of laterally extending integral arms 116. The arms 116 are arranged in two relatively closely adjacent pairs defining therebetween rectangular openings 117 dimensioned to receive the front portions of the insulator 74 of the connector modules. In the case of the zero insertion force module 70, the movable part 106 of the module is dimensioned to have a sliding fit within the opening 117 so that the arms 116 engage the upper and lower surfaces of the part.

The actuating member is mounted at the rear of the cavities in the connector shell 38 against the rear face of the partition 44 before any of the connector modules are mounted in the cavities. It is noted that the partition is formed with rearwardly extending short bosses 118, which are engaged by the front faces of the module shells 72. As a consequence, a small space is provided between each shell and the rear face of the partition 44. The actuating member 112 is slidable vertically in this space. The arms 116 on the actuating member are disposed on opposite sides and closely adjacent to the bosses 118.

Referring again to the zero insertion force connector module 70 mounted in cavity 48, it is seen that the lower end of the movable part 106 of the insulator engages the bottom of the opening 64 in the partition, while the upper end of the movable part 106 is spaced from the upper edge of the opening 64. In addition, the arm 116 adjacent to the upper end of the cavity 48 is spaced from the hub 80 on the module 70 in cavity 50. As a consequence, when upward vertical movement is imparted to the actuating member 112, the arm 116 at the bottom of the cavity 48 pushes the movable part 106 of the insulator upwardly thereby actuating the contact 108. When the actuating member 112 is shifted downwardly, the arm 116 at the upper end of the cavity 48 pushes the movable part 106 of the insulator downwardly to thereby disengage the contacting portion 110 of the contact 103 from the mating fixed contact in the connector member 36. The actuating member 112 simultaneously actuates the contacts in the zero insertion force connector module 70 mounted in cavity 50 in the same manner as the module mounted in connector 48, and would likewise actuate the contacts in other zero insertion force connector modules mounted in any other of the cavities in the shell 38.

A conventional electrical connector module 70a (in contrast to a zero insertion force module) is mounted in the cavity 46 in the same manner as the modules 70 are mounted in cavities 48 and 50. The module 70a is identical to the module 70 except that it contains one or more fixed contacts 108a rather than movable contacts. In addition, the front part 106a of module 70a is fixed, rather than movable, and is shorter in the vertical direction than the movable part 106 of the zero insertion force module. As a consequence, the lower end of the insulator part 106a is spaced upwardly from the arm 116 of the actuating member 112 extending across the lower end of the cavity 46. As a consequence, when the actuating member 112 is shifted upwardly, there is relative movement between the lower arm 116 and the insulator 106a. Therefore, movement of the actuating member does not impart any movement to the insulator 106a or to the contact 108a in the module 70a. It is noted that the fixed contact 108a is shown as being a pin contact, which is retained in a bore 120 by means of a contact retention clip 122. The pin contact 108a engages a mating socket contact, not shown, in the connector member 36 when the box 12 is slid to the rear of the support 14.

Alternatively, the contact 108a may be a socket contact which engages a mating pin contact in the connector member 36. Further, the fixed contact 108a may be a coaxial contact, an optical fiber termination pin, etc.

Since the actuating member 112 is movable with respect to the conventional electrical connector module 70a, the conventional connector module may be mounted in any of the cavities 46, 48, 50, or 52 and it will not interfere with the actuation of the movable contacts in the modules 70. Furthermore, the zero insertion force modules 70 may be mounted in any of the cavities, or all the cavities, depending upon the requirements of the avionics of the aircraft. Likewise, conventional connector modules 70a may be mounted in all of the cavities of the connector assembly.

It will, of course, be appreciated that the connector member 36 would likewise be a modular connector assembly as the assembly 34 and will embody a plurality of modules arranged in the same fashion as the modules in the assembly 34 on the box. If desired, any one of the module cavities, for example the cavity 52, may be left open in both connector members so as to communicate with an air duct 123 coupled to the connector member 36. The air duct will allow warm air to be withdrawn from the avionics box 12.

Preferably, a tapered alignment pin 124 extends rearwardly from the connector member 34 for insertion into an alignment opening 126 in the connector member 36, as best seen in FIG. 2. At the lower end of the connector assembly 34, a pair of polarizing keys 128 may be provided for cooperating with polarizing keyways, not shown, in the connector member 36.

Mechanism for shifting the actuating member 112 to effect actuation of the movable contacts in the zero insertion force connector modules will now be described. A yoke 140 is integrally formed on the lower end of the actuating member 112. A shaft 142 extends laterally across the lower end of the connector shell 38, as seen in FIGS. 4 and 5. A pinion gear 144 is rotatably mounted on the shaft 142. Eccentric cams 146 are integrally formed on opposite sides of the gear 144. A rack 148 is slidably mounted lengthwise along the bottom of the connector shell 38 underneath the pinion gear 144. The teeth of the gear 144 engage the teeth on the rack 148 so that longitudinal movement of the rack causes the gear to rotate, thereby rotating the eccentric cams 146. Rotation of the cams 180° causes the yoke 140 and hence the actuating frame 112 to lift to actuate the movable contacts in the modules 70. In the position of the cams and rack shown in full lines in FIG. 4, the cams are in their unactuated position. An opening 150 is formed in the front of the shell 38 in alignment with the rack 148. When the rack is shifted to move the cams into their actuated position, the rack assumes the position shown in dotted lines in FIG. 4, wherein it extends beyond the front 42 of the shell 38 and engages the front of the connector member 36, shown in fragmentary form only in FIG. 4. The engagement of the rack with the connector member 36 causes the box 12 to shift rearwardly slightly, preferably about .025 inch, which causes an axial wiping engagement to be effected between the engaging surfaces of the contacts in the respective modules in mating connector members 34 and 36. This wiping engagement insures good electrical connection between the contacts even in a dust laden or otherwise contaminated environment. Furthermore, the wiping engagement of the contacts removes oxides on the engaging surfaces of the contacts thereby providing a more reliable electrical connection.

Figure 3:
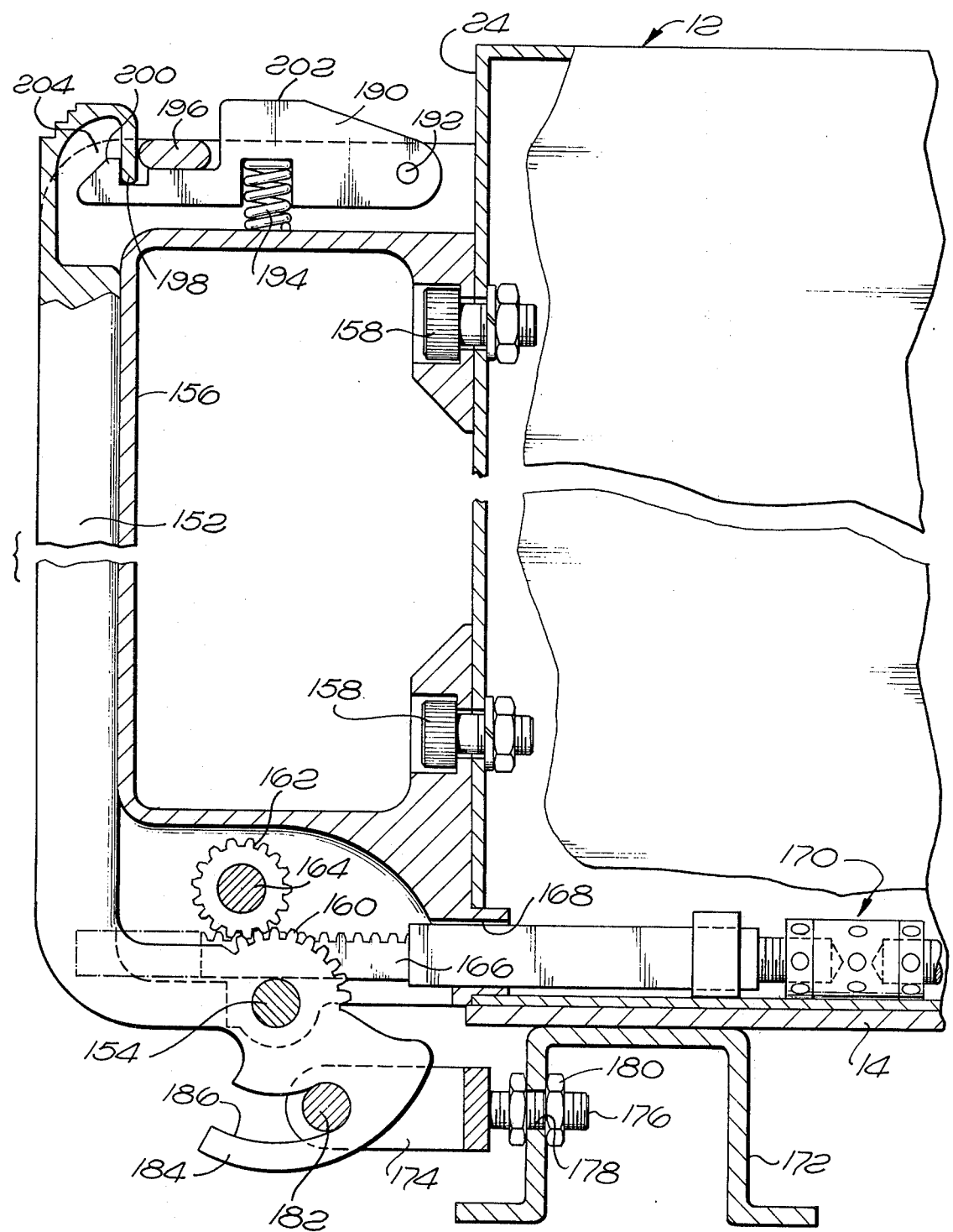
FIG. 3 is an enlarged fragmentary, longitudinal sectional view through the front end of the box and support illustrated in FIGS. 1 and 2 showing the actuating handle in its actuated position.

Reference is now made to FIGS. 1 to 3 which illustrate the actuating mechanism at the front of the avionics box 12 which effects longitudinal movement of the rack 148 at the rear of the box for actuating and disengaging the movable contacts in the zero insertion force modules 70 in connector assembly 34. Such mechanism includes a handle 152 which is pivotally mounted on a laterally extending pin 154 mounted in the lower region of a frame 156 fixed to the front 24 of the box 12 by screws 158. The pin 154 is parallel to and adjacent to the lower front edge of the box. the frame 156 has a U-shaped cross-section, as seen in FIG. 1. The handle 152 is capable of pivotal movement between the horizontal position illustrated in FIGS. 1 and 2 to the vertical position illustrated in FIG. 3 in which the handle is disposed within the hollow cross-section of the frame 156. A section of a pinion gear 160 is integrally formed on the lower end of the handle 152. The gear section 160 engages an idler gear 162 which is rotatable about a horizontal extending pivot pin 164 on the lower end of the frame 156 above the pin 154. The idler gear 162 has a set of teeth which engage a rack 166 which is slidably mounted for longitudinal movement in an opening 168 in the frame 156 that opens into the interior of the box 12. A turn-buckle assembly, generally designated 170, connects the rack 166 to the rack 148 which extends to the rear of the avionics box. The turn-buckle assembly permits fine adjustment of the length of the rack assembly to take up any variations in the length of the box which may occur because of the manufacturing tolerances in forming sheet metal boxes.

A pair of mounting brackets 172 and 173 underlie the support 14. A yoke 174 extends forwardly from the front bracket 172. The yoke includes a threaded shank 176 which passes through an opening 178 in the front bracket. A pair of locking nuts 180 on the shank 176 permits forward and rearward adjustment of the yoke relative to the support 14.

A locking pin 182 is mounted transversely on the forward ends of the legs of yoke 174. A hook 184 is formed on the lower end of the actuating handle 152. The hook is defined by an arcuate slot 186 which is dimensioned and disposed to receive the pin 182 when the handle is shifted to its upper vertical position, as seen in FIG. 3. In this position of the handle and hook, the box 12 cannot be shifted forwardly on the support 14 and cannot be lifted upwardly. Thus, the hook 184 and pin 182 provide a latching arrangement to assure that the box is firmly retained on the support 14 when the actuating handle 152 is raised. When the handle is in the position shown in FIG. 3, the movable contacts in the zero insertion force connector modules at the rear of the box are actuated, as will be seen later.

The handle 152 is releasably retained in its upper position by means of a spring biased locking clip 190. The clip is pivotally mounted on a laterally extending pivot pin 192 on the frame 156. A spring 194 urges the clip 190 in an upward direction. A cross-member 196 on the frame limits the extent of upward movement of the clip. A downwardly extending locking tab 198 is formed on the upper end of the handle 152. A hook 200 on the end of the clip 190 engages the tab 198 to prevent the handle from being shifted downwardly to release the latching mechanism at the lower end of the handle and to operate the rack and pinion arrangement in the box 12. To release the locking clip 190, the operator pushes downwardly on the upper surface 202 of the clip against the force of the spring 194, thereby releasing the hook 200 from the tab 198. The hook end 200 of the clip has a tapered outer surface 204. When the handle 152 is pivoted from its lower horizontal position to its upper position, the tab 198 engages the tapered surface 204, thereby camming the hook end 200 of the clip 190 downwardly permitting the tab 198 to engage behind the hook. Thus, when the handle 152 is pushed to its upper vertical position, it is automatically locked in that position by the clip 190.

It is noted that the pinion gear 160 on the handle 152 at the front of the box is twice as large as the pinion gear 144 in the connector assembly at the rear of the box. As a consequence, 90° rotation of the gear 160 by the handle 152 will produce a 180° rotation of the pinion gear 144 and, hence, 180° rotation of the eccentric cams 146 which actuate the movable contact actuating member 112 at the rear of the box.

Normally when the avionics box 12 is being transported from a shop to the aircraft, the actuating handle 152 is in its upper position as illustrated in FIG. 3 and the operator carries the box by the frame 156 which contains the handle. In this position of the handle, the movable contacts 108 in the zero insertion force connector modules 70 at the rear of the box are in their active position. In order for modules 70 on the connector assembly 34 to engage with zero insertion force with the mating modules in the connector member 36, the movable contacts 108 must be shifted to their inactive position. To accomplish this, the operator shifts the handle 152 downwardly to its horizontal position as illustrated in FIGS. 1 and 2. During such pivotal movement of the handle 152, the idler gear 162 is rotated in a clockwise direction causing the rack 166 at the front of the box to shift forwardly to the position shown in phantom lines in FIG. 3 and, hence, the rack 148 in the connector assembly 34 to shift to the position illustrated in full lines in FIG. 4 so that the eccentric cams 146 will move the actuating member 112 downwardly to deactivate the movable contacts in the zero insertion force modules. With the handle in such lower position, the box 12 is then shifted to the rear of the support 14 until the connector members 34 and 36 mate. In such position, the fixed contacts 108a in the conventional connector modules 70a will be in electrical engagement with their mating contacts in the corresponding modules in connector member 36. Typically, the number of fixed contacts in the module 70a is relatively small so that the mating or insertion forces are relatively low.

In order to activate the movable contacts in the modules 70, the handle 152 is shifted upwardly from the position illustrated in FIGS. 1 and 2 to the position shown in FIG. 3. During such movement of the handle, the idler gear 162 is rotated counterclockwise which shifts the racks 166 and 148 rearwardly. Such rearward movement of rack 148, as explained before, causes the eccentric cams 146 to lift the actuating member 112 and thereby actuate the movable contacts 108 in the zero insertion force connector modules. During the last few degrees of the upward movement of the handle 152, the rack 148 extends through the opening 150 in the front of the connector assembly and engages the front face of the mating connector member 36 thereby causing the box 12 to shift forwardly a short distance on the support 14 and thereby impart an axial wiping movement between the mating contacts in the connectors. Also, during the upward movement of the handle 152, the hook 184 simultaneously engages over the locking pin 182 to securely latch the box on the support 14. This latching arrangement prevents the box from being removed from the support while the movable contacts in the modules 70 are in their actuated position and prevents the box from moving vertically or forwardly. The locking clip at the top of the frame 156 automatically retains the handle in its actuated position.

It will be appreciated that because the handle 152 must be lowered to its horizontal position illustrated in FIGS. 1 and 2 to release the latching mechanism at the lower end of the handle, the movable contacts in the zero insertion force connector modules will be simultaneously shifted to their unactuated position, thereby permitting the mating connector assemblies 34 and 36 to be readily disengaged. It is further seen that if the handle is in it raised position as illustrated in FIG. 3 in which the movable contacts are actuated, the avionics box 12 cannot be fully slid to the rear of the support 14 since the lower end of the handle 152 forming the hook 184 will engage the locking pin 182 on the bracket 172. Thus, the movable contacts in the zero insertion force connector modules cannot be inadvertantly damaged by forcing them into engagement with the fixed contacts in the mating connector member 36 by pushing the box fully to the rear of the support 14.

It is seen from the foregoing that by the present invention there is provided a movable actuating element, namely the handle 152, at the front of the avionics box 12, an actuating member 112 at the rear of the box for actuating the movable contacts in the zero insertion force modules, and a motion transmitting means including the pinion gear segment 160, idler gear 162, rack 166, turnbuckle 170, rack 148, gear 144, and cams 146 for transmitting the motion of the handle 152 to the actuating member 112. The motion transmitting elements are mounted in the frame 156 at the front of the box and extend through the lower end of the box to the rear thereof and, therefore, are not exposed to the outer environment where they may be damaged or adversely affected by dust or other contaminants in the environment. Furthermore, the actuating mechanism of the present invention is of simple construction, requires only a minimum number of parts and provides all the necessary safety features to assume that the movable contacts in the zero insertion force modules are properly actuated and that the box is effectively retained on the support 14 when the contacts are fully actuated.

While a cam and rack motion transmitting arrangement has been described herein for actuating the movable contacts in connector member 34, other motion transmitting means could be used such as toggle, lever or camming arrangements.

Figure 10:
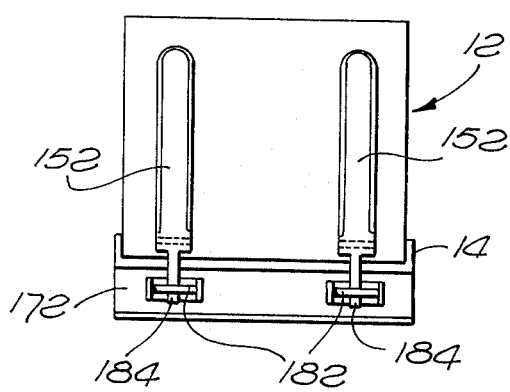
FIG. 10 is a front view of a modified form of the electronic packaging assembly of the present invention embodying a pair of connector actuating handles at the front of the box.
Figure 11:
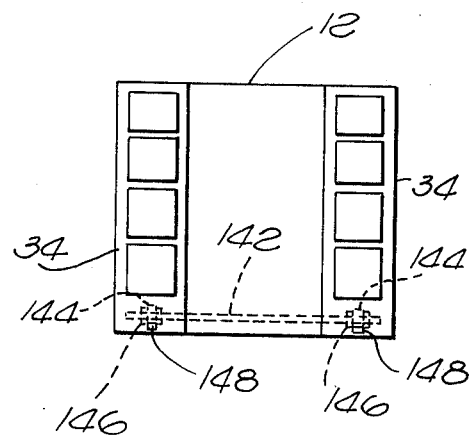
FIG. 11 is a rear view of the box illustrated in FIG. 10 embodying a pair of electrical connector assemblies at the rear which are operated by the handles at the front of the box illustrated in FIG. 10.

Reference is now made to FIGS. 10 and 11 which illustrate a modified form of the invention in which like reference numerals are utilized to designate like or identical parts to those employed in the embodiment illustrated in FIGS. 1 to 9. As can be seen, the box 12 in FIGS. 10 and 11 is somewhat wider than the box illustrated in FIGS. 1 to 3. A pair of connector assemblies 34 are mounted on the rear of the box 12. A pair of actuating handles 152 are mounted on the front of the box. The handles are independently mounted for pivotal movement on a pair of pivot pins 154. Each handle embodies a latching hook 184 for engaging a locking pin 182 mounted on the front mounting bracket 172. A rack arrangement is associated with each of the pivotal handles 152 in the same manner described hereinbefore.

The ends of the rear racks 148 are visible in FIG. 11. Such racks engage pinion gears 144 which carry eccentric cams 146 and are fixed to a common shaft 142 which is mounted in the rear of the box for rotation about its longitudinal axis. Thus, the actuation of either one of the handles 152 will cause rotation of the shaft 142, thereby rotating each of the two sets of cams 146 and shifting the respective actuating members 112 in the pair of connector assemblies 34 to actuate the movable contacts therein. This arrangement assures that both the connector assemblies 34 will be properly activated even if one of the actuating handles 152 or the associated motion transmitting mechanism associated therewith fails. Such an arrangement is particularly useful when the avionics box requires redundant circuitry for safety control. Furthermore, the double handle arrangement allows uniform, slight retraction of the box on the support 14 by the engagement of the rear ends of the racks 148 with the mating connector members at the rear of the support 14 (not shown in FIGS. 10 or 11) to provide wiping engagement between all the contacts, and also affords dual latching of the front of the box to the support.

What is claimed is:

1. An electronic packaging assembly comprising:
   a generally flat stationary support having a front and a rear;
   a box for containing electronic components slidable on the upper surface of said support from said front, said box having a front and a rear;
   a first set of fixed contacts at said rear of said support;
   a second set of movable contacts at said rear of said box, said first and second sets of contacts being positioned adjacent to but spaced from each other when said box is slid to said rear of said support;
   means for moving said second set of movable contacts to engage said first set of contacts, said means including a movable actuating element on said front of said box, a contact actuating member at said rear of said box engaging said movable contacts and movable relative thereto, and motion transmitting means extending through said box from said front to said rear thereof for transmitting movement from said actuating element to said contact actuation member; and
   said moving means also including a latching hook at said front of said box cooperating with said support to prevent lifting of said front of said box off of said support and prevent forward movement of said box on said support surface.

2. An assembly as set forth in claim 1 wherein:
   said moving means simultaneously engages said contacts and operates said latching hook.

3. An assembly as set forth in claim 1 wherein:
   said moving means includes means preventing said box from being slid to said rear of said support when said movable contacts are positioned by said moving means to engage said first set of contacts.

4. An assembly as set forth in claim 1 wherein:
   said latching hook is carried by said actuating element.

5. An assembly as set forth in claim 4 wherein:
   said actuating element comprises a handle pivoted about a laterally extending axis adjacent to the lower end of said front of said box and parallel to said support surface;
   said latching hook is formed on said handle; and
   a pin is fixed relative to said support parallel to and below said axis, said pin receiving said latching hook when said handle is pivoted to actuate said movable contacts.

6. An electronic packaging assembly comprising:
   a generally flat stationary support having a front and a rear;
   a box for containing electronic components slidable on the upper surface of said support from said front, said box having a front and a rear;
   a first set of fixed contacts at said rear of said support;
   a second set of movable contacts at said rear of said box, said first and second sets of contacts being positioned adjacent to but spaced from each other when said box is slid to said rear of said support;
   means for moving said second set of movable contacts to engage said first set of contacts, said means including a movable actuating element on said front of said box, a contact actuating member at said rear of said box engaging said movable contacts and movable relative thereto, and motion transmitting means extending through said box from said front to said rear thereof for transmitting movement from said actuating element to said contact actuating member; and
   said moving means shifting said box forwardly slightly when said moving means actuates said movable contacts thereby providing wiping engagement between said first and second sets of contacts.

7. An electronic packaging assembly comprising:
   a generally flat stationary support having a front and a rear;
   a box for containing electronic components slidable on the upper surface of said support from said front, said box having a front and a rear;
   a first set of fixed contacts at said rear of said support;
   a second set of movable contacts at said rear of said box, said first and second sets of contacts being positioned adjacent to but spaced from each other when said box is slid to said rear of said support;
   means for moving said second set of movable contacts to engage said first set of contacts, said means including a movable actuating element on said front of said box, a contact actuating member at said rear of said box engaging said movable contacts and movable relative thereto, and motion transmitting means extending through said box from said front to said rear thereof for transmitting movement from said actuating element to said contact actuating member;
   said rear of said box having an opening therein aligned with said motion transmitting means;
   a stationary member located behind said box; and
   said motion transmitting means comprising an elongated, longitudinally reciprocal rod, said rod shifting rearwardly in said box when said moving means actuates said movable contacts, the rear of said rod extending through said opening to engage said stationary member to cause said box and, hence, said movable contacts to shift forwardly slightly when said moving means actuates said movable contacts, thereby providing wiping engagement between said first and second sets of contacts.

8. An electronic packaging assembly comprising:
   a generally flat stationary support having a front and a rear;

a box for containing electronic components slidable on the upper surface of said support from said front, said box having a front and a rear;

a first set of fixed contacts at said rear of said support;

a second set of movable contacts at said rear of said box, said first and second sets of contacts being positioned adjacent to but spaced from each other when said box is slid to said rear of said support;

means for moving said second set of movable contacts to engage said first set of contacts, said means including a movable actuating element on said front of said box, a contact actuating member at said rear of said box engaging said movable contacts and movable relative thereto, and motion transmitting means extending through said box from said front to said rear thereof for transmitting movement from said actuating element to said contact actuating member;

a modular connector assembly on said rear of said box;

said assembly comprising a shell containing a plurality of connector module cavities;

separate connector modules removably mounted in at least some of said cavities; and at least one of said modules containing said movable contacts.

9. An assembly as set forth in claim 8 wherein:

a plurality of said modules contain said movable contacts; and said moving means simultaneously actuates said movable contacts in said modules regardless of the cavities in which said modules are mounted.

10. An assembly as set forth in claim 8 wherein:

another of said connector modules contains at least one fixed contact; and said moving means actuates said movable contacts in said one module without moving said fixed contact in said other module.

11. An assembly as set forth in claim 8 wherein:

one of said cavities is open; and an air duct is fixed relative to said support and aligned with said open cavity behind said box.

12. An electronic packaging assembly comprising:

a generally flat stationary support having a front and a rear;

a box for containing electronic components slidable on the upper surface of said support from said front, said box having a front and a rear;

a first set of fixed contacts at said rear of said support;

a second set of movable contacts at said rear of said box, said first and second sets of contacts being positioned adjacent to but spaced from each other when said box is slid to said rear of said support;

means for moving said second set of movable contacts to engage said first set of contacts, said means including a movable actuating element on said front of said box, a contact actuating member at said rear of said box engaging said movable contacts and movable relative thereto, and motion transmitting means extending through said box from said front to said rear thereof for transmitting movement from said actuating element to said contact actuating member;

a modular connector assembly on said rear of said box;

said assembly comprising a shell containing a plurality of connector module cavities;

a first connector module removably mounted in one of said cavities and containing said movable contacts;

a second connector module removably mounted in another of said cavities and containing at least one fixed contact; and said moving means actuates said movable contacts regardless of the cavity in which said first connector module is mounted.

13. A modular electrical connector assembly comprising:

a connector shell containing a plurality of connector module cavities;

a connector module removably mounted in one of said cavities and containing a plurality of movable contacts;

means on said shell for moving said contacts simultaneously for engaging a plurality of fixed contacts in a mating connector member;

a second connector module containing at least one fixed contact and removably mounted in a second one of said cavities; and said moving means actuating said movable contacts in said first-mentioned module without moving said fixed contact in said second module regardless of the cavities in which said modules are mounted.

14. A modular electrical connector assembly as set forth in claim 13 wherein:

said cavities are disposed in a row;

said moving means includes an actuator cam at one end of said row and an elongated actuating member extending lengthwise of said row, said cam functioning to shift said member along its axis in one direction to actuate said movable contacts upon operation of said moving means; and said first module is mounted in a cavity in said row further from said cam than said second module.

15. A modular electrical connector assembly as set forth in claim 13 wherein:

said cavities are disposed in a row;

said moving means includes an actuator cam at one end of said row and an elongated actuating member extending lengthwise of said row along the side of said cavities, said cam functioning to shift said member along its axis in one direction to actuate said movable contacts upon operation of said moving means; and said actuating member embodying transversely extending arms each extending into one of said cavities at the side of said cavity closest to said cam.

16. A modular electrical connector assembly as set forth in claim 15 wherein:

each said module comprises a shell containing an insulator, said insulator in said first module including a fixed part and a movable part, said movable part lying in the path of an arm of said actuating member; and the arm of said actuating member extends into said cavity in which said first module is mounted engaging said movable part and shifting the same when said cam functions to shift said member in said one direction; and the arm of said actuating member extending into said cavity in which said second module is mounted being movable relative to said second module insulator during shifting of said member in said one direction.

17. A modular electrical connector assembly as set forth in claim 16 wherein:
the length of said second module insulator in the plane of said actuating member is shorter than the length of said first module movable part in the direction of said row.

18. A modular electrical connector assembly comprising:
a connector shell containing a plurality of connector module cavities;
a connector module removably mounted in one of said cavities and containing a plurality of movable contacts;
means on said shell for moving said contacts simultaneously for engaging a plurality of fixed contacts in a mating connector member;
said moving means actuating said movable contacts regardless of the cavity in which said module is mounted;
a box for containing electronic components having a front and a rear;
said connector shell being mounted on said rear of said box; and
said moving means including a movable actuating element at said front of said box, a contact actuating member in said shell and motion transmitting means extending from said front to said rear of said box for transmitting movement from said actuating element to said contact actuating member.

19. A modular electrical connector assembly as set forth in claim 18 wherein:
said motion transmitting means extends rearwardly of the rear of said connector shell when said moving means actuates said movable contacts.

20. A modular electrical connector assembly as set forth in claim 19 wherein:
said motion transmitting means comprises an elongated, longitudinally reciprocal rod, said rod shifting rearwardly in said box when said moving means actuates said movable contacts, the rear of said rod extending through and beyond said connector shell for engaging said mating connector member to effect minor movement therebetween.

21. A modular electrical connector assembly as set forth in claim 18 wherein:
said movable actuating element is pivotally mounted at the front of said box; and
said motion transmitting means extends rearwardly through said box.

22. A modular electrical connector assembly as set forth in claim 21 wherein:
said movable actuating element comprises a handle pivoted about an axis adjacent and parallel to the bottom of said box at said front; and
said handle embodies a latching hook located below said box when said handle is pivoted to an upright position adjacent to said front of said box.

23. A modular electrical connector assembly comprising:
a connector shell containing a plurality of connector module cavities;
individual connector modules removably mounted in at least two or said cavities and containing a plurality of movable contacts;
each said module comprising a housing containing a fixed insulator and a movable insulator, said contacts being simultaneously movable by shifting of said movable insulator;
elongated actuating means movable lengthwise in said shell for simultaneously shifting said movable insulators in said modules to cause said contacts therein to simultaneously engage a plurality of fixed contacts in a mating connector member;
said actuating means shifting said movable insulators regardless of the cavities in which said modules are mounted; and
said modules being removable from said cavities without removing said actuating means from said shell.

* * * * *